(12) United States Patent
Foster et al.

(10) Patent No.: US 8,466,760 B2
(45) Date of Patent: Jun. 18, 2013

(54) CONFIGURABLE POWER SUPPLY USING MEMS SWITCH

(75) Inventors: John S. Foster, Santa Barbara, CA (US); Christopher S. Gudeman, Lompoc, CA (US)

(73) Assignee: Innovative Micro Technology, Goleta, CA (US)

( * ) Notice: Subject to any disclaimer, the term of this patent is extended or adjusted under 35 U.S.C. 154(b) by 52 days.

(21) Appl. No.: 12/929,257

(22) Filed: Jan. 11, 2011

(65) Prior Publication Data

US 2011/0130721 A1 Jun. 2, 2011

Related U.S. Application Data

(63) Continuation-in-part of application No. 11/797,924, filed on May 9, 2007, now Pat. No. 7,893,798.

(51) Int. Cl.
*H01H 51/22* (2006.01)
(52) U.S. Cl.
USPC .......................................... 335/78; 200/181
(58) Field of Classification Search
USPC ............................................ 335/78; 200/181
See application file for complete search history.

(56) References Cited

U.S. PATENT DOCUMENTS

| | | | |
|---|---|---|---|
| 5,563,002 A * | 10/1996 | Harshe | 429/7 |
| 6,396,372 B1 | 5/2002 | Sakata et al. | |
| 6,486,425 B2 | 11/2002 | Seki | |
| 6,731,022 B2 * | 5/2004 | Silverman | 307/43 |
| 6,872,902 B2 * | 3/2005 | Cohn et al. | 200/181 |
| 7,008,812 B1 | 3/2006 | Carley | |
| 7,119,943 B2 | 10/2006 | Nelson et al. | |
| 7,663,456 B2 * | 2/2010 | Subramanian et al. | 335/78 |
| 2005/0240891 A1 * | 10/2005 | Just et al. | 716/10 |
| 2006/0286706 A1 | 12/2006 | Salian et al. | |
| 2006/0286707 A1 | 12/2006 | Hooper et al. | |

* cited by examiner

*Primary Examiner* — Bernard Rojas
(74) *Attorney, Agent, or Firm* — Jaquelin K. Spong

(57) ABSTRACT

Systems and methods for forming a configurable power supply uses a plurality of dual substrate MEMS switches to couple a plurality of power cells to provide a selectable, or variable, output voltage. The same circuit may output two different voltages to power two different circuits of the device, or may distribute the load evenly amongst the cells. Thus, the configurable power supply may extend the lifetime and improve the reliability of the device, or decrease its weight, size and cost.

19 Claims, 7 Drawing Sheets

CONFIGURABLE POWER SUPPLY USING MEMS SWITCH

CROSS REFERENCE TO RELATED APPLICATIONS

This U.S. patent application is a continuation-in-part of U.S. patent application Ser. No. 11/797,924 (Attorney Docket No. IMT-V3), filed May 9, 2007, assigned to Innovative Micro Technology, and incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to a configurable battery which provides selectable voltage outputs. More particularly, this invention relates to a configurable battery using MEMS switches to produce a selectable output.

Microelectromechanical systems (MEMS) are devices often having moveable components which are manufactured using lithographic fabrication processes developed for producing semiconductor electronic devices. Because the manufacturing processes are lithographic, MEMS devices may be made in very small sizes, and in large quantities. MEMS techniques have been used to manufacture a wide variety of sensors and actuators, such as accelerometers and electrostatic cantilevers. MEMS techniques may be used to fabricate small, movable members which open or close an electrical connection to form a MEMS switch, by raising and lowering a shunt bar across two electrical terminals.

Configurable power supplies are also known, as exemplified by U.S. Pat. No. 6,731,022 to Silverman, et al. However, this reference does not anticipate the use of MEMS switches to change the configuration of power cells in such a power supply. In fact, referring to U.S. Pat. No. 5,563,002 to Harshe, Silverman suggests that such a system is not possible, as he states "Mechanical switches inherently exhibit relatively slow response times as compared to solid state devices. It is physically impossible to instantaneously reconfigure multiple power busses using mechanical switches. Harshe's proposed array is not functional as a combined serial-parallel array. If Harshe's proposed array were to in some way be made functional in a combined serial-parallel configuration, and a cell became defective, there is no disclosed way of bypassing that cell on the serial side." Silverman, col. 3, lines 32-52.

SUMMARY

Silverman apparently does not anticipate MEMS switches, especially the MEMS switch design disclosed herein, which may be made sufficiently small, fast and robust that they can handle large amounts of current and provide essentially instantaneously varying voltage and current levels to various loads. When used in conjunction with a power supply comprising a plurality of individual cells, the cells may be ganged together to provide a plurality of output voltages, or to distribute the load evenly among the cells. This configurable ability may lead to improvements in reliability, lifetime, size cost and weight of the power supplies. These are especially important considerations in portable applications, for which considerations as to size and weight of the battery are paramount. Furthermore, Silverman evidently teaches against the application of MEMS, and mechanical switches in general, as being unsuitable to this application.

A configurable power supply using a particular type of proprietary MEMS switch is described further below, which resolves the shortcomings of mechanical switches in the configurable power supply application. Described below is a particular application of such a configurable power supply to a laptop computer device. However, this embodiment is exemplary, and such a configurable power supply may be applied to any number of limited- or stored-charge situations, such as battery power of portable communications systems. The configurable power supply may eliminate expensive, bulky components which presently make up the voltage converters in these devices. Such systems need to minimize power consumption in order to prolong battery lifetime or decrease the weight and size of the battery.

The configurable power supply described herein may make use of a particular type of MEMS switch, a dual substrate MEMS Switch described in co-pending U.S. patent application Ser. No. 11/797,924, and incorporated by reference in its entirety, and is assigned to the same assignee as the instant application. This switch has an architecture which is particularly suited to the handling of large, DC currents. While the embodiment described below uses dual substrate MEMS switches in particular, it should be understood that this embodiment is exemplary, and that other types of MEMS switches may be used in conjunction with a configurable power supply, to provide a plurality of output voltages or to distribute the duty cycle evenly amongst the cells of the battery.

The dual substrate MEMS plate switch uses two substrates, a first, lower substrate (the "switch" substrate) on which a deformable plate is formed with at least one electrical shunt bar thereon, which provides an electrical connection between two contacts of a switch. These contacts may be formed on a second, upper substrate (the "via" substrate). After forming these structures, the two substrates are bonded together to form the switch. It should be understood that the designation of "upper" and "lower" is arbitrary, that is, the deformable plate may also be formed on an upper substrate and the contacts may be formed on a lower substrate.

Accordingly, in the systems and methods described here, the MEMS switch may be form using a silicon-on-insulator (SOI) substrate, including a silicon device layer, dielectric layer, and silicon handle layer. The deformable plate is attached to the first SOI substrate by one or more narrow spring beams formed in the device layer of the SOI substrate. These spring beams remain fixed at their proximal ends to the silicon dioxide and handle layer of the SOI substrate. A portion of the silicon dioxide layer adjacent to the deformable plate may be etched to release the plate, however, a silicon dioxide attachment point remains which couples the spring beams supporting the deformable plate to the silicon handle layer. The silicon dioxide layer therefore provides the anchor point for adhesion of the deformable plate to the first, lower SOI substrate from which it was made. Because the remainder of the rigid, SOI wafer remains intact, it may provide protection for the switch against inadvertent contact and shock.

The dual substrate MEMS switch design may have a number of advantages over other MEMS designs, particularly for the configurable power supply application. For example, in the dual substrate design, through wafer vias are used to route the current in and out of the switch. These vias provide large thermal heat sinks to the switch, so that large currents can be handled without damage. Also, because of its unique design, the activation speed of the switch is sufficiently fast to provide multiple voltages without affecting the apparent performance of the device.

These and other features and advantages are described in, or are apparent from, the following detailed description.

BRIEF DESCRIPTION OF THE DRAWINGS

Various exemplary details are described with reference to the accompanying drawings, which however, should not be taken to limit the invention to the specific embodiments shown but are for explanation and understanding only.

DETAILED DESCRIPTION

In the following disclosure, the architecture of the MEMS switch will be described first, followed by the configurable power supply using the MEMS switch.

In the systems and methods described here, an electrostatic MEMS switch is fabricated on two substrates. A deformable plate carrying at least one shunt bar is formed on the first substrate, and the electrical contacts of the switch, which will be connected via the shunt bar on the deformable plate, are formed on the other substrate. The two substrates may then be sealed hermetically by a gold-indium seal. Electrical access to the switch may be afforded by a set of through hole vias, which extend through the thickness of the second substrate. Although the systems and methods are described as forming the deformable plate first on the first substrate followed by the electrical contacts on the second substrate, it should be understood that this embodiment is exemplary only, and that the electrical contacts may be formed first, or in parallel with, the formation of the deformable plate.

Figure 1:
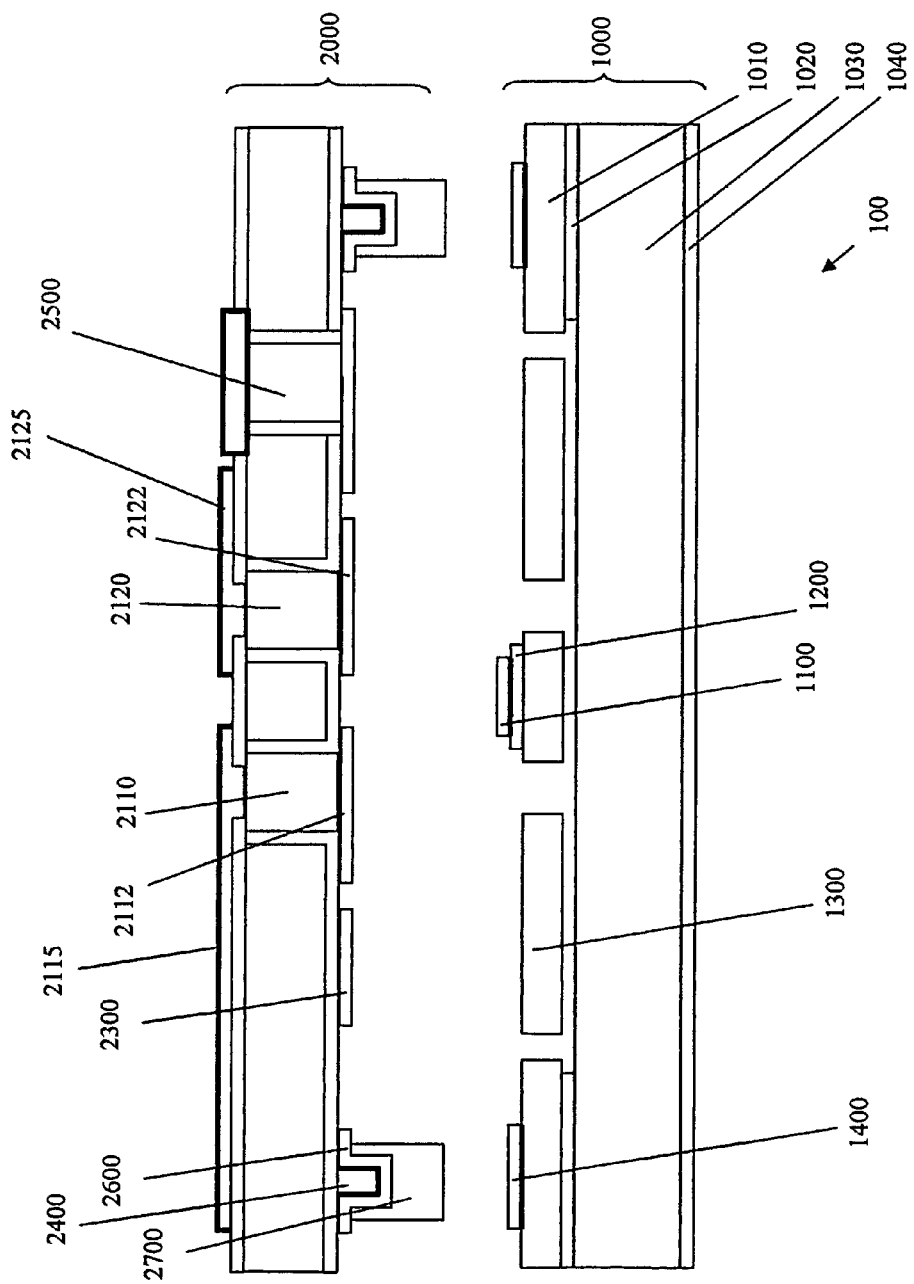
FIG. 1 is a cross sectional view of an exemplary dual substrate electrostatic MEMS plate switch before bonding of the substrates.

FIG. 1 is a cross sectional view of the dual substrate electrostatic MEMS switch 100 fabricated on two substrates, a switch substrate 1000 and a via substrate 2000. The switch substrate 1000 may be an SOI wafer, and the via substrate may be a silicon wafer, for example. The SOI switch substrate 1000 may include a device layer 1010, a dielectric layer 1020 and a handle layer 1030. The MEMS switch 100 may include a plate 1300 bearing at least one shunt bar 1100. The plate may be deformable, meaning that it is sufficiently thin compared to its length or its width to be deflected when a force is applied, and may vibrate in response to an impact. For example, a deformable plate may deflect by at least about 10 nm at its center by a force of about 1 μNewton applied at the center, and is sufficiently elastic to support vibration in a plurality of vibrational modes. The deformable plate 1300 may be formed in and made up of the device layer of the SOI substrate. The deformable plate 1300 may be suspended above the handle layer 1030 of an SOI substrate by four spring beams (not shown in FIG. 1), which are themselves affixed to the handle layer 1030 by anchor points formed from the dielectric layer 1020 of the SOI switch substrate 1000. As used herein, the term "spring beam" should be understood to mean a beam of flexible material affixed to a substrate at a proximal end, and formed in substantially one plane, but configured to move and provide a restoring force in a direction substantially perpendicular to that plane. The deformable plate may carry at least one, or alternatively two or more conductive shunt bars which operate to close the switch 100, as described below.

Each shunt bar is designed to span two contact points, 2110 and 2120, which are through wafer vias formed in the via substrate 2000, and covered by a layer of contact material 2112 and 2122, respectively. The deformable plate may be actuated electrostatically by an adjacent electrostatic electrode 2300, which may be disposed directly above (or below) the deformable plate 1300, and may be fabricated on the via substrate 2000. The deformable plate 1300 itself may form one plate of a parallel plate capacitor, with the electrostatic electrode 2300 forming the other plate. When a differential voltage is placed on the deformable plate 1300 relative to the adjacent electrostatic electrode 2300, the deformable plate is drawn toward the adjacent electrostatic electrode 2300. The action raises (or lowers) the shunt bar 1100 into a position Where it contacts the contact points 2110 and 2120, thereby closing an electrical circuit.

Although the embodiment illustrated in FIG. 1 shows the deformable plate formed on the lower substrate and the vias and contacts formed on the upper substrate, it should be understood that the designation "upper" and "lower" is arbitrary. The deformable plate may be formed on either the upper substrate or lower substrate, and the vias and contacts formed on the other substrate. However, for the purposes of the description which follows, the embodiment shown in FIG. 1 is presented as an example, wherein the plate is formed on the lower substrate and is pulled upward by the adjacent electrode formed on the upper substrate.

The electrostatic MEMS switch 100 may be made defining the deformable plate 1300 and shunt bar 1110 on the first SOI substrate 1000, and the contacts 2112 and 2122 and drive plate 2300 on the second substrate 2000. The shunt bar may be deposited and etched in the desired region, while the deformable plate 1300 may be formed by deep reactive ion etching through the device layer of an SOI substrate. The shunt bar 1100 may be electrically isolated from the conductive deformable plate 1300 by an isolation layer 1200, which may be a dielectric such as silicon dioxide. Additional details regarding the fabrication of the electrostatic MEMS plate switch may be found in the incorporated '924 application.

As described more fully in the '924 application, the deformable plate formed on the first substrate may carry one or more shunt bars 1100, placed at or near the nodal lines for a vibrational mode of the deformable plate. Points along these lines remain relatively stationary, even though the deformable plate may still be vibrating in the vibrational mode. In one exemplary embodiment, the deformable plate may carry two shunt bars, each placed on a nodal line for a particular vibrational mode of the deformable plate known as the (2,0) mode, hereinafter called the third mode. This mode is well known to those well versed in the art of plate modes. By placing the shunt bars in these locations along nodal lines, the switch is relatively insensitive to continuing vibrations, and the switch may remain closed even when the deformable plate is still moving.

Figure 2:
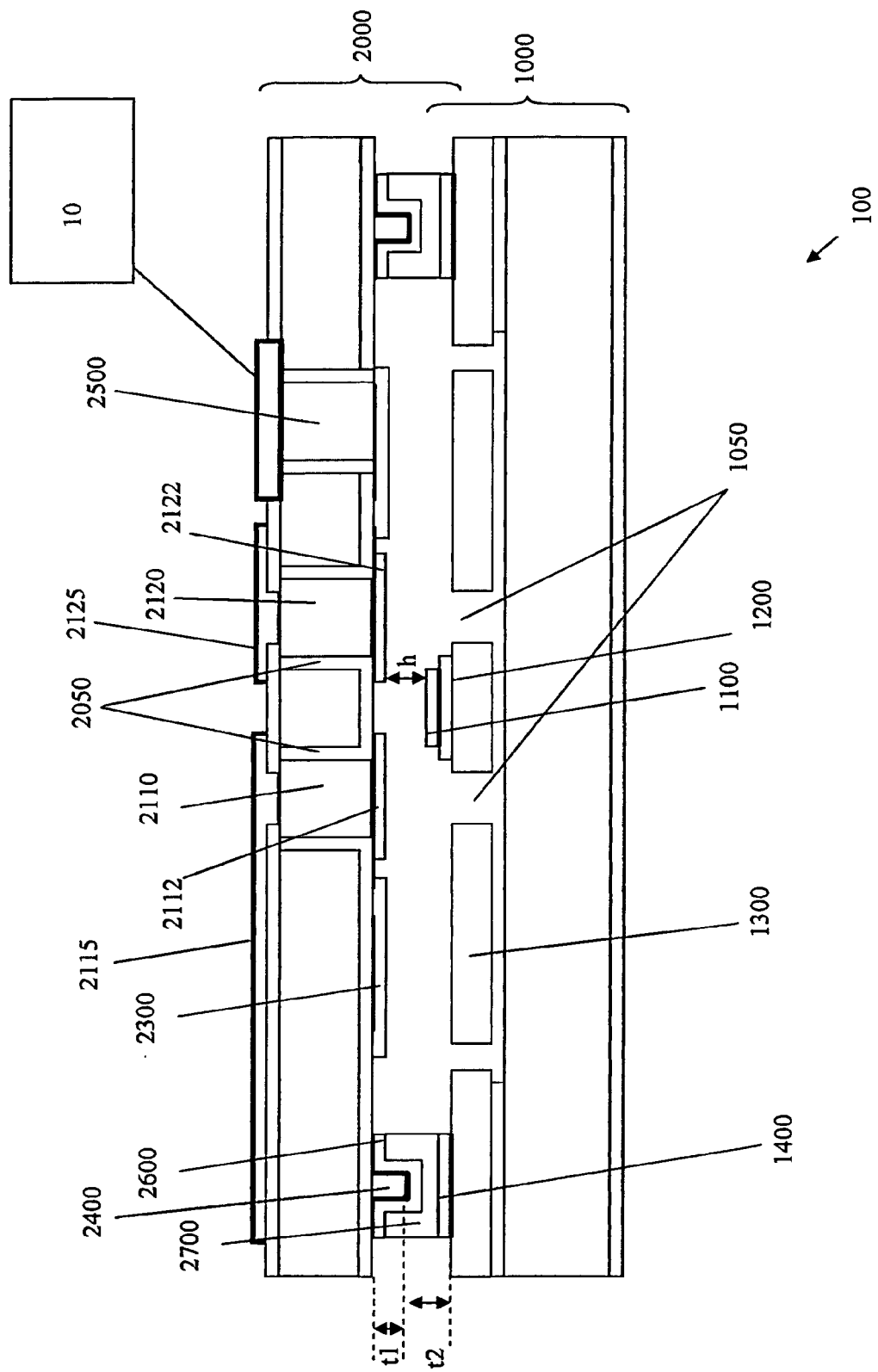
FIG. 2 is a cross sectional view of an exemplary dual substrate electrostatic MEMS plate switch upon completion of fabrication.

FIG. 2 shows an individual dual substrate electrostatic MEMS plate switch 100 after manufacture and assembly. In its completed state, the shunt bar 1100 on the deformable plate 1300 hangs adjacent to and spanning the electrical contacts 2110 and 2120, and the deformable plate 1300 is also adjacent to the drive plate 2300, as shown in FIG. 1. Upon applying appropriate voltages to the deformable plate 1300 and drive plate 2300, a differential voltage forms across the parallel plate capacitor formed by the deformable plate 1300 and the electrode 2300, drawing the deformable plate 1300 toward the electrode 2300. At it lower point of travel or vibration of the deformable plate 1300, the shunt bar 1110 affixed to the deformable plate 1300 is applied across the electrical contacts 2110 and 2120 of the switch 100, thereby closing the switch. An input electrical signal applied to one of the electrical contacts 2110 by conductive bonding pad 2115 may then be obtained as an output electrical signal from the other contact 2120 by the other conductive bonding pad 2125. The switch may be opened by discontinuing the voltages applied to the plate 1300 and electrode 2300, whereupon the switch may return to its original position because of the restoring spring force acting on the stiff spring beams 1330 coupled to the deformable plate 1300.

The opening and closing of the switch 100 may be controlled by a microprocessor 10, which may deliver a voltage to the drive plate 2300 to close the switch. Although not shown in FIG. 2, it should be understood that the microprocessor 10 may also provide the switched signals to input and output electrodes 2110 and 2120. In the application described below, the input and output of the switch may instead be a voltage or current produced from a power cell. In this case, the purpose of MEMS switch 100 is to connect one terminal of a power cell or battery cell to another terminal of another power cell or battery cell, or to an input or output terminal of the configurable power supply as described below.

Figure 3:
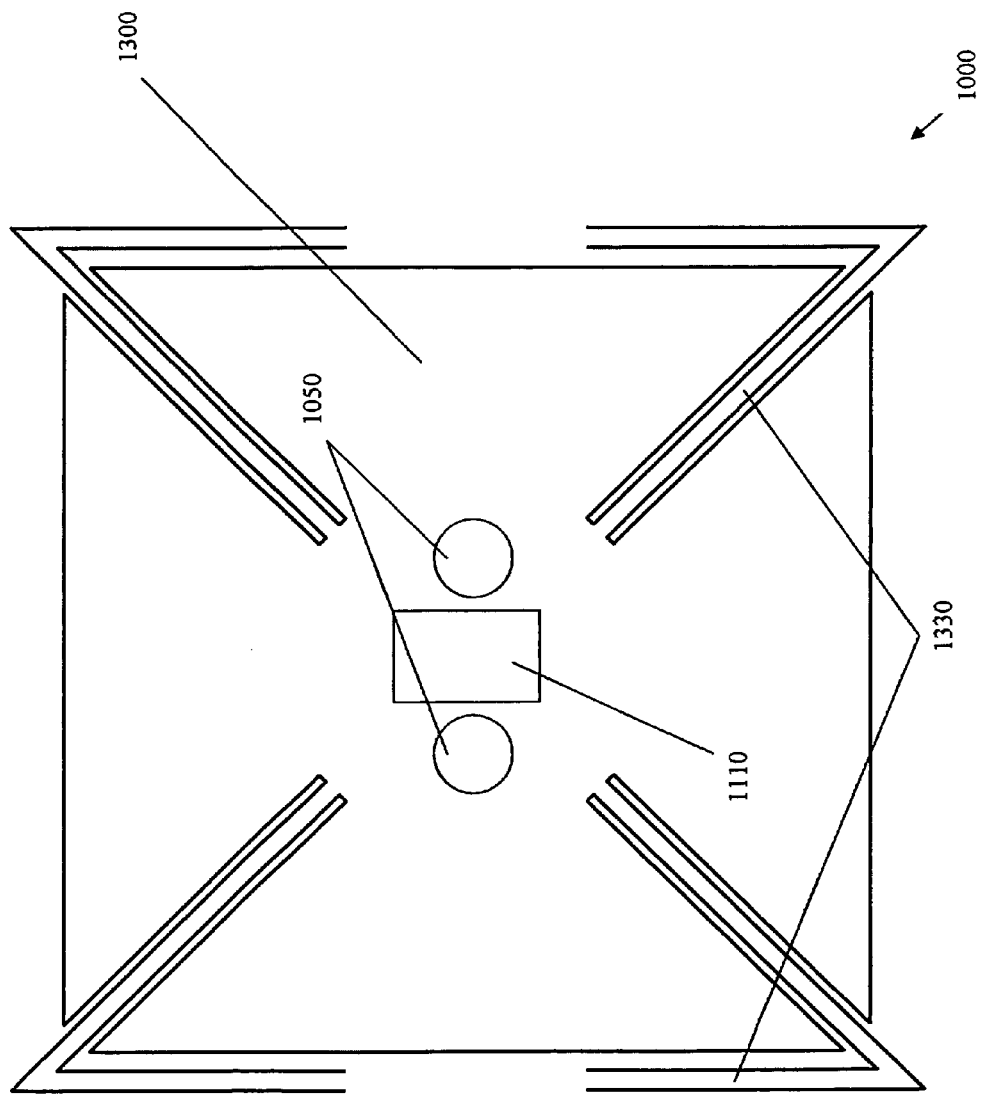
FIG. 3 is a plan view of one exemplary embodiment of the switch substrate of the dual substrate electrostatic MEMS plate switch of FIG. 1, showing the locations of the shunt bar near the center of the deformable plate.

A plan view of an exemplary dual substrate MEMS switch wafer 1000 is shown in FIG. 3. In one exemplary embodiment, the deformable plate is coupled to the first, SOI substrate by the four flexible spring beams 1330 which are anchored to the dielectric layer of the SOI substrate at the proximal end of each spring beam. The other end of the spring beams may be contiguous with the deformable plate. The spring beams 1330 may include a substantial bend, at least ninety degrees for example, so that each spring beam on one side of the deformable plate extends in an opposite direction from the other. The orientation of the spring beams may allow a twisting motion during closure or vibration, which may provide a scrubbing action to the deformable plate. The scrubbing action may clear contamination and debris, thus reducing the contact resistance between the shunt bars on the deformable plate and the contacts located on the second substrate. Holes 1050 may be formed in the deformable plate 1300 to help insure that the area of the plate 1300 near the contacts 2110 and 2120 does not short the contacts unintentionally, or as a result of plate vibration. These holes may also allow gas to move between the sides of the plate 1300, such that squeeze film damping does not slow the opening or closing of the device 100.

Figure 4:
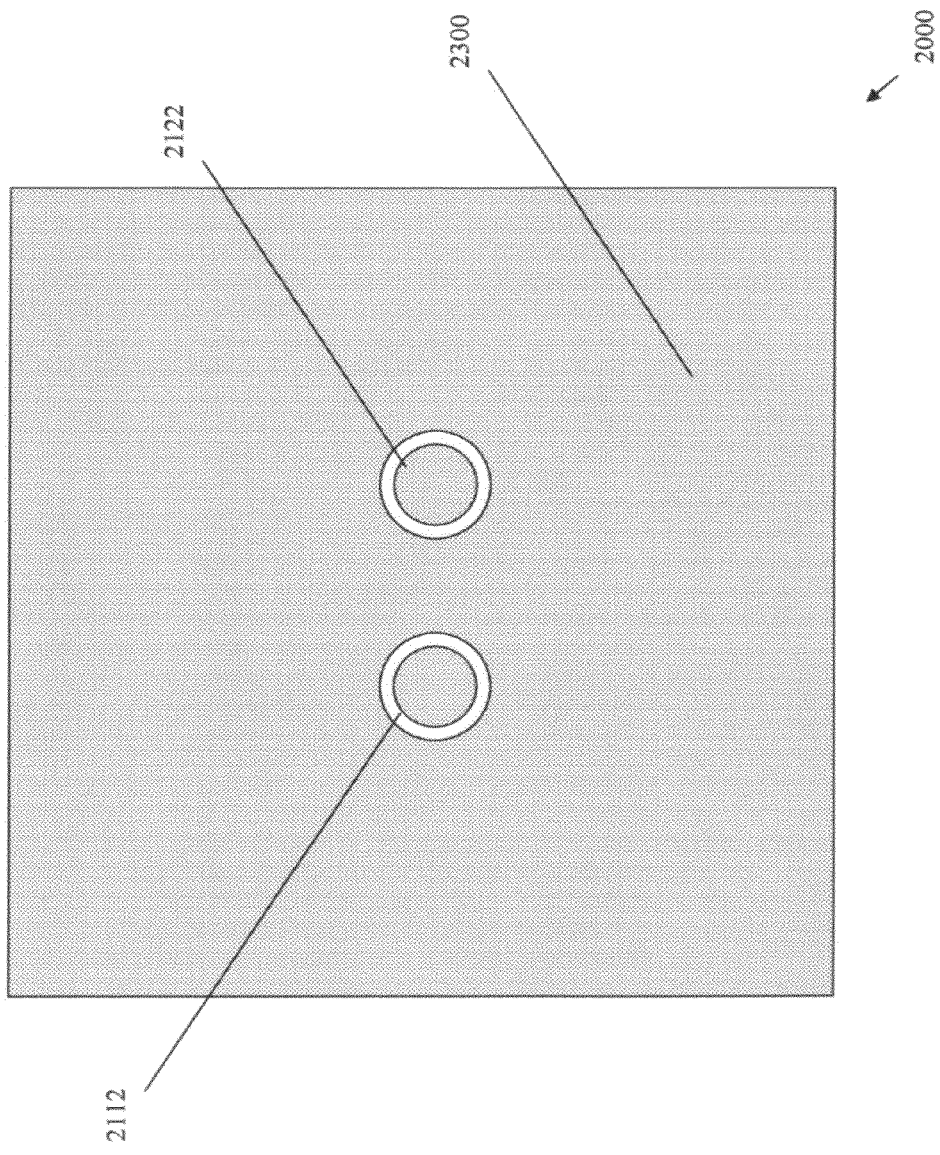
FIG. 4 is a plan view of the via substrate of the dual substrate MEMS switch of FIG. 1, showing the positions of the contacts and the electrostatic drive plate.

As mentioned previously, the vias and electrical pads may be formed on a second substrate 2000, as shown in FIG. 4. By forming the conductive features on separate substrates, the cleanliness of the contact points may be maintained during processing, before the substrates are sealed hermetically. The via substrate 2000 may be, for example, silicon, glass, or any other suitable material consistent with the process described below, or suitable equivalent steps. In one exemplary embodiment, the via substrate is a 500 µm thick silicon wafer. The via substrate 2000 may be covered with a photoresist, which is patterned in areas corresponding to the locations of vias 2110, 2120, and 2500, or other electrical conduits that will be formed in the via substrate 2000.

Blind trenches may first be etched in the substrate 2000, for the formation of a set of vias 2110, 2120, and 2500 which will be formed in the trenches by plating copper into the trenches. A "blind trench" is a hole or depression that does not penetrate through the thickness of the via substrate 2000, but instead ends in a dead end wall within the material. The etching process may be reactive ion etching (RIE) or deep reactive ion etching (DRIE), for example, which may form blind trenches, each with a dead-end wall. After etching and filling the vias with copper, for example, the dead end wall of the vias may be removed by backgrinding the via substrate after it has been bonded to the switch substrate 1000 to form through wafer vias shown in FIG. 1. The via 2500 may provide electrical access to the electrostatic drive plate 2300 which forms the other side of the parallel plate capacitor; via 2110 may provide electrical access to one of the contact electrodes 2112 of the switch; via 2120 may provide electrical access to the other contact electrode 2122 of the switch, and so forth.

The conductive pads 2112, 2122 and electrostatic drive plate 2300 on the via substrate 2000 may be formed by depositing or electroplating a conductive material such as gold, with or without additional adhesion layers such as chromium or barrier layers such as molybdenum. Appropriate techniques are disclosed in the incorporated '924 application.

As illustrated in FIG. 4, the electrostatic drive plate 2300 may be quite extensive with respect to the conductive pads 2112 and 2122. As a result, the electrostatic force acting on the deformable plate 1300 can be considerable. Accordingly, the switching speed of the dual substrate MEMS switch 100 may be quite fast, well under 10 µsec. Furthermore, a plurality of through holes in the deformable plate 1300, not shown in FIG. 3, but used in the fabrication of the device as described in the incorporated '924 application, may allow air to move easily to either side of the deformable plate 1300. This can reduce the squeeze film effects which might otherwise slow the device.

The switch substrate 1000 and via substrate 2000 may then be bonded together to form the sealed switches, which are subsequently diced or singulated. The seal 2700 joining the two substrates 1000 and 2000 may be hermetic, and may be a eutectic or metal alloy bond. In one embodiment, the bond is made by forming an alloy of gold and indium, $AuIn_x$, where x is about 2, between the surfaces of the two substrates. The alloy may be formed by melting a layer of indium 2700 deposited over a layer of gold or Cr/Au conductive layer 2600 deposited on either the switch wafer 1000 or the via wafer 2000. Another layer of gold 1400 may be deposited on the other wafer. The gold and indium are then melted to form the alloy which bonds the substrates. The hermetic seal is therefore also conductive, and may provide electrical access to the deformable plate, for example. The hermetic seal may be particularly important for switching applications involving relatively high voltage signals, wherein an insulating gas may be needed to prevent electrical breakdown of the environment between the high voltage electrodes. In such cases, the insulating gas, or vacuum, may need to be sealed hermetically to create an environment for the MEMS switch which can withstand higher voltages without breaking down, without allowing the gas to leak out of, or into, the MEMS switch seal.

The seal 2700 may further include a raised feature 2400 within the bondline. The raised feature may be a rigid standoff or "Monorail," as described more fully in U.S. Pat. No. 7,569,926, assigned to Innovative Micro Technology, the same assignee as the present invention. The presence of the rigid standoff may help in formation of the proper alloy, and thus the hermeticity of the seal, and may also determine the separation between the switch wafer 1000 and the via wafer 2000.

The systems and methods described herein may be appropriate for the fabrication of a configurable power supply, because of the ability of the dual substrate MEMS switch to handle large currents, and its fast switching speed. In particular, the dual substrate MEMS switch 100 illustrated in FIGS. 1-4 may have a number of advantages over other switch designs, such as cantilevered mechanisms wherein the switch contacts are disposed at the end of a cantilevered beam. For example, the dual substrate switch 100 may be made more compact than a cantilevered switch, because a long length of cantilevered beam is not required to have a sufficiently flexible member to actuate with modest voltages. For example, the plate design illustrated in FIG. 2 may be actuated with only 40 volts, because the spring beams 1330 which support the deformable plate may be made relatively flexible, without impacting the spacing between the electrical contacts 2110 and 2120. The characteristic dimensions of the sealed, packaged switch 1000 may be well under 1 mm on a side.

Because the restoring force of the switch is determined by the spring beam 1330 geometry, rather than the plate 1300 geometry, modifications may be made to the plate 1300 design without affecting the kinematics of the spring beams 1330. For example, as mentioned above, a plurality of etch release holes may be formed in the deformable plate 1300, without affecting the stiffness of the restoring spring beams 1330. These release holes may allow air or gas to transit readily from one side of the deformable plate 1300 to the other side, thereby reducing the effects of squeeze film damping, which would otherwise reduce the speed of the device. These etch release holes may also reduce the mass of the deformable plate 1300, also improving its switching speed, without affecting the restoring force acting on the deformable plate 1300 through the spring beams 1330. The fast switching speed is important, especially in the configurable power supply application described below.

By placing the shunt bars near the nodal lines of a vibrational mode as mentioned earlier, the switching speed may be improved because the shunt contact movement is minimal, even if the plate is still vibrating in this mode. Therefore, although the deformable plate may be made exceptionally light and fast because of its small size and plurality of etch release holes, the contacting part of the switch is not undergoing vibratory oscillation. Accordingly, the electrostatic MEMS plate switch illustrated in FIG. 6 may be used in a vacuum environment, which is often not possible because in a vacuum, vibrations are no longer damped by viscous air motion around the moving member of the switch. This allows very fast switching times for this switch, which is useful in switching power supply voltages in a time small enough to not cause interruption of the powered device.

The through wafer vias 2110 and 2120 may also act as heat sinks, leading the heat generated in the switch to be directed quickly to the opposite side of the wafer and to the large bonding pads 2115 and 2125 on the backside of the device (FIG. 1) for dissipation.

Exemplary thicknesses of various layers of the dual substrate electrostatic MEMS plate switch 100 are shown in FIG. 2. It should be understood that the features depicted in FIG. 2 may not necessarily be drawn to scale. As shown in FIG. 2, an exemplary thickness of the Cr/Au conductive layer 2600 is about 0.75 µm. An exemplary distance h between the upper surface of the shunt bar 1100 and the lower surface of the contact point 2112, also defined as the throw of the switch, may be, for example, about 1.0 µm. An exemplary thickness of the conductive material of the shunt bar 1100 and contacts 2122 and 2112 may be, for example, about 0.75 µm each. An exemplary thickness of the deformable plate 1300 may be about 5.0 µm, which may also be the thickness of the device layer 1010. An exemplary thickness of the isolation layer 1200 may be about 0.3 µm. Finally, an exemplary thickness t1 of the raised feature 2400 may be about 1.0 µm, which also defines a minimum separation between the plate substrate 1000 and the via substrate 2000, of the dual substrate electrostatic MEMS switch 100. An exemplary thickness t2 of the alloy bond (In material as well as Cr/Au multilayers) may be about 1.7 µm. It should be understood that the dimensions set forth here are exemplary only, and that other dimensions may be chosen depending on the requirements of the application.

The dual substrate MEMS switch 100 can function as a four-terminal switch with a gate signal (50V) on drive plate 2300, ground potential on the bondline 1400 which grounds the deformable plate 1300, and input signal on input line 2112 and an output signal on output line 2122 when the switch is closed. Using the dimensions set forth above for dual substrate MEMS switch, the actuator voltage may be about 50V, and the actuation time may be less than about 10 µsec. For many applications such as those described below, this speed is sufficient to provide a variable voltage output to power the subcircuits of a system, such as a laptop computer. Thus, the dual substrate MEMS switch 100 may replace other switches such as transistors in applications where it has a performance advantage.

For at least these reasons, the dual substrate MEMS switch 100 may be applicable to the configurable power supply application described below. In the following circuit diagrams, each of switches 110-430 may be similar or identical dual substrate MEMS switches 100, or they may be some mixture of MEMS switches, transistors or relays, depending on the performance requirements of the switch. However, each circuit includes at least one MEMS switch. In one embodiment, each of switches 110-430 comprises a dual substrate MEMS switch 100, as illustrated if FIGS. 1 and 2.

The term "cell" or "power cell" as used herein refers to a sub-element of a power supply, each of which provides a portion of the total output. For example, if the power supply is a DC battery, each cell generates electrical energy from chemical bases. The bases may include at least one of nickel cadmium, nickel-metal hydride, lead-acid, lithium ion, and lithium-ion polymer materials. The term "battery" as used herein should be understood to mean a device which supplies a voltage or current from a chemical reaction within the device. Well known car batteries, for example, are generally lead-acid batteries which include six cells coupled in series to provide a 12V, 15A output power sufficient to start a gasoline or diesel engine. Accordingly, one application of the configurable power supply is in a transport vehicle such as gasoline or diesel-powered car, or to supply the various voltages needed in an all-electric or hybrid car. In the configurable power supply described hereinafter, such cells may be arranged in a multitude of ways by opening and closing a plurality of MEMS switches, which configure the supply to generate a particular, or variable output voltage. The switch configuration may also be altered to distribute the duty cycle evenly over the participating cells, or to avoid or eliminate a non-functioning or exhausted cell. Furthermore, cells could be alternated on and off of the load in those cases where there is demand for high current, which can polarize a battery due to the relatively slow diffusion of the charge carries across a membrane. This alternation provides a rest period in which the diffusion can repolarize the membrane.

Figure 5:
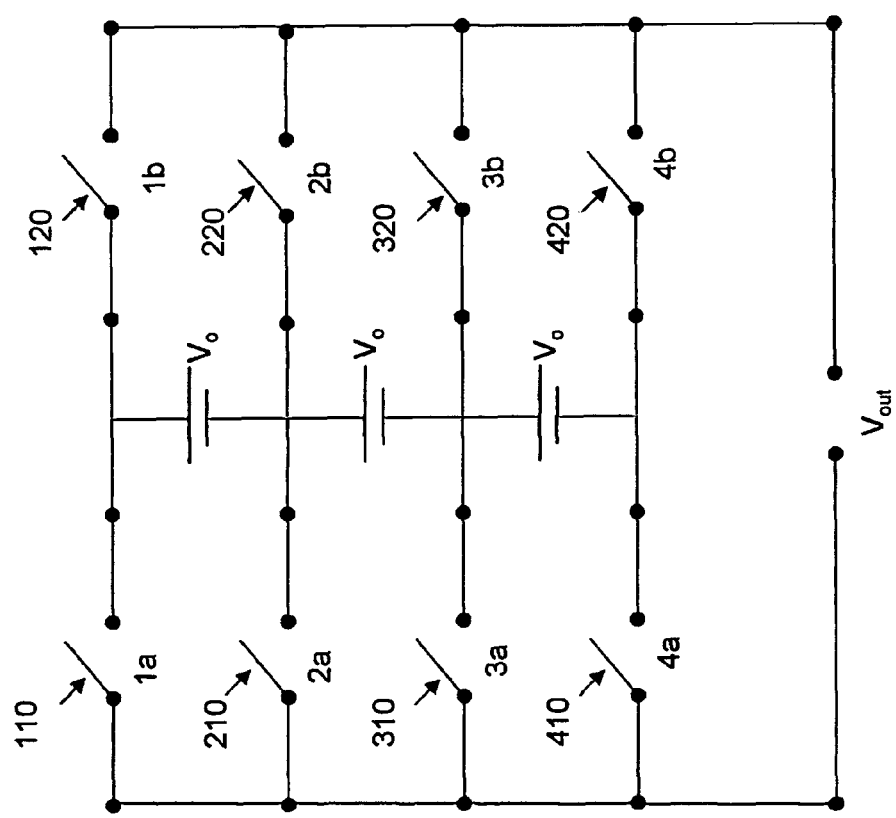
FIG. 5 is a schematic circuit drawing of first exemplary embodiment of a configurable power supply using the dual substrate MEMS switch of FIG. 1.

In one exemplary embodiment, a plurality of MEMS switches 100 are used to connect a subset of power cells together to provide a specified output voltage. An example of such a circuit is shown schematically in FIG. 5. FIG. 5 shows a battery having three cells, each of which outputs a voltage $V_0$. The overall output voltage of the circuit is $V_{out}$. The output level of the circuit is selectable and configurable by virtue of the closure of the appropriate switches 110-420. For example, to output a voltage Vo, switches 110 and 220 are closed, or switches 210 and 320 are closed, or switches 310 and 420, and so on with the other switches remaining open. For similar circuits having an arbitrarily large number of cells and switches, to output $V_0$, close na and (n+1)b. To output a voltage $mV_o$: close na, (n+m)b. To output a voltage $-V_o$, close (n+1)a, nb. To output a voltage $-mV_o$: close (n+m)a, nb. Clearly, a large number of voltages can be provided by activating the appropriate number of switches in the appropriate configuration. Furthermore, the load can be shared by multiple configurations providing the same output voltage, by switching between these configuration and described further below. Note also that the configuration shown in FIG. 5 permits the polarity of the voltage across the load to be reversed. This can be particularly important in applications where adaptive response is needed, such as when a load (or battery) is mistakenly installed backwards.

Figure 6:
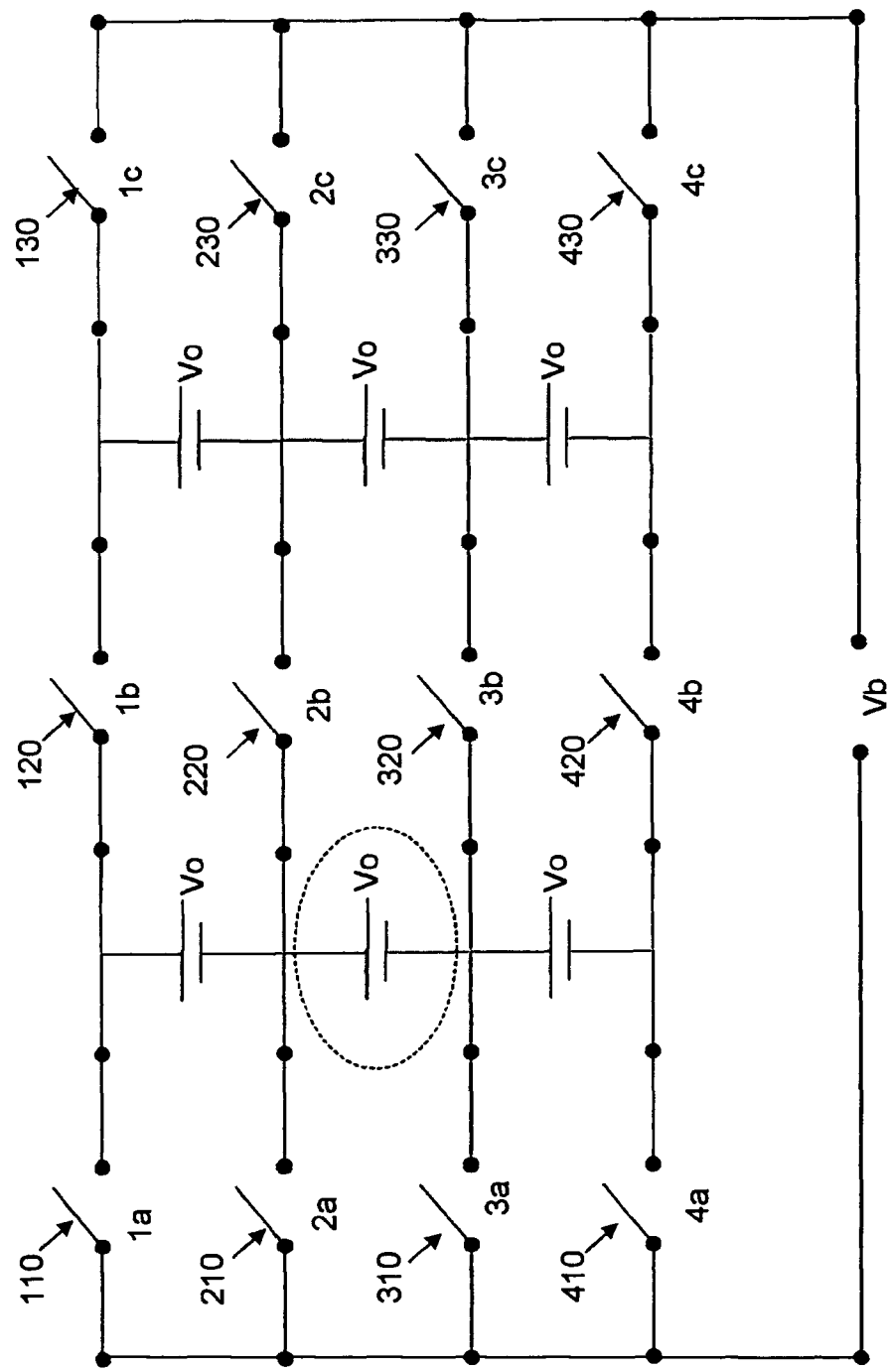
FIG. 6 is a schematic circuit diagram of a second exemplary embodiment of a configurable power supply using the dual substrate MEMS switch of FIG. 1.

The circuit shown in FIG. 5 can be expanded to include a larger number of cells as shown in FIG. 6. For the circuit shown in FIG. 6, and multiple of the single cell voltage $V_0$ can be output by the circuit as follows. To output a voltage $mV_0$, close the switches corresponding to na, (n+m)b and (n+m)c. Or alternatively, close na, nb and (n+m)c. It will be apparent that this basic technique may be extended to an arbitrarily large number of cells and arbitrarily large number of switches.

If the configurable power supply shown in FIG. 6 detects that a particular cell is non-functioning or exhausted, the open/closed switch configuration can be altered to avoid or eliminate that cell. For example if the cell circled in FIG. 6 is to be avoided or eliminated, to produce an output voltage $2V_0$, switches 110, 220 and 330 would be closed.

A key enabling feature of the dual substrate MEMS switch 100, is its ability to handle DC currents, and to hot switch those currents. Although MEMS switches in general are known for having difficulty in hot switching applications, because the cells may one be invoked one cell at a time, the hot-switched voltage are low, typically 0.6V to 3V. The dual substrate MEMS switch has been shown to be able to handle these voltages at substantial levels of current. Alternatively, additional passive devices, either microfabricated or macroscopic, may be used to protect the MEMS switch 100, using, for example, a diode. When the device is first activated, the diode will carry the first "hot" switched current, and then the resistance of the diode is vanquished with the second parallel MEMS relay.

By using the exemplary circuits shown in FIGS. 5 and 6, a selectable voltage may be output from the circuit which includes, or avoids, certain battery cells. Using such a technique, the load may be distributed evenly throughout the battery cells, thus prolonging its useful lifetime. A cell's output, or the duration of its use, may be monitored and that cell avoided if it appears to be nearing the end of its functional life. Similarly, a cell which has somehow been damaged or destroyed may also be avoided.

Deep cycling, wherein a battery cells voltage is substantially or entirely depleted, is known to cause early failure of batteries. By distributing the load evenly between the cells, deep cycling of any one of the cells may be avoided, thus prolonging the life and making the system more reliable. The battery may be operated under computer or microprocessor control, which is instructed to avoid certain damaged cells or to distribute the load between different cell configurations, in order to prolong the lifetime of the battery. Prolonging the lifetime of batteries may lead to a reduction in their cost and weight, which is of primary concern, especially for portable devices such as laptops and military communications equipment.

The configurable power supply may also be used advantageously to recharge the battery cells. For example, in an electric car, the action of braking, traveling down hill or using a charger may provide a reverse current that can, if but for a brief time, recharge the cells. Using the configurable array, individual cells may be selected for recharging, based on their remaining charge or their duty cycle.

There are a number of non-obvious advantages to the configurable power supply with MEMS switches. First, there is an efficiency advantage. The configurable power supply would allow the system to run without the eddy-current and hysteretic losses of current motor controller systems, such as pulse-width modulation schemes, which use a variable duty cycle to control a motor system. For coupling to an ac-motor, the dc control may be accomplished with configurable power supply, then the dc current converted to ac and then delivered to the electric motor. Second, as mentioned previously, the configurable battery is expected to improve battery reliability and lifetime. By monitoring the individual cells and draining them appropriately, battery life would be maximized. This may then allow a reduction in size, cost and weight of the batteries. Third, the heat generated by the battery can be controlled and distributed, reducing cooling requirements. This may also lead to improvements in size, cost, weight, reliability and lifetime. Finally, the size of the power supply and its ancillary components may be reduced, because of the very small size of the dual substrate MEMS switch.

One application of the configurable power supply is as an electric motor controller. That is, to control the voltage/current between a power supply (battery) and an electric motor, achieving a variable power output (or power generation) from the motor. Such a configurable power supply may be of particular use in the coming availability of electric cars, as the car has multiple subcircuits which require different voltages, such as dashboard and headlights, guidance and communications systems, and electronics. Another application is laptop computers, which also have various subsystems with different requirements. For example, the display of the laptop computer may require higher voltages than the microprocessor. For this reason, laptop computers today use bulky and expensive voltage converters. These converters are very noisy and require both capacitors and inductors to filter out this "chopper" noise. The converters may also require a bandgap reference circuit, which may not be needed with the configurable power supply described below. Finally, battery life will be extended for both the time between charges and the number of charges to failure, since the load is uniform and controlled.

The techniques described herein may be applied to any portable device, for which the size, weight and time between charging is especially critical. Such loads may be portable communications equipment such as cell phones and radios, or other portable electronic equipment such as radars or transmitters. Especially for military communication applications, size, weight, reliability and time between rechargings are critical considerations. These techniques can also be used in medical devices or application where energy efficiency and size are very important. These applications include hearing aid batteries, drug delivery pumps, pace makers, implantable devices, and generally all devices containing multiple loads In short, there are substantial advantages of the configurable power supply using MEMS switches in terms of efficiency, reliability, size, cost and weight. These advantages are expected to be particularly significant for portable applications, for which size and weight are particularly important.

Figure 7:
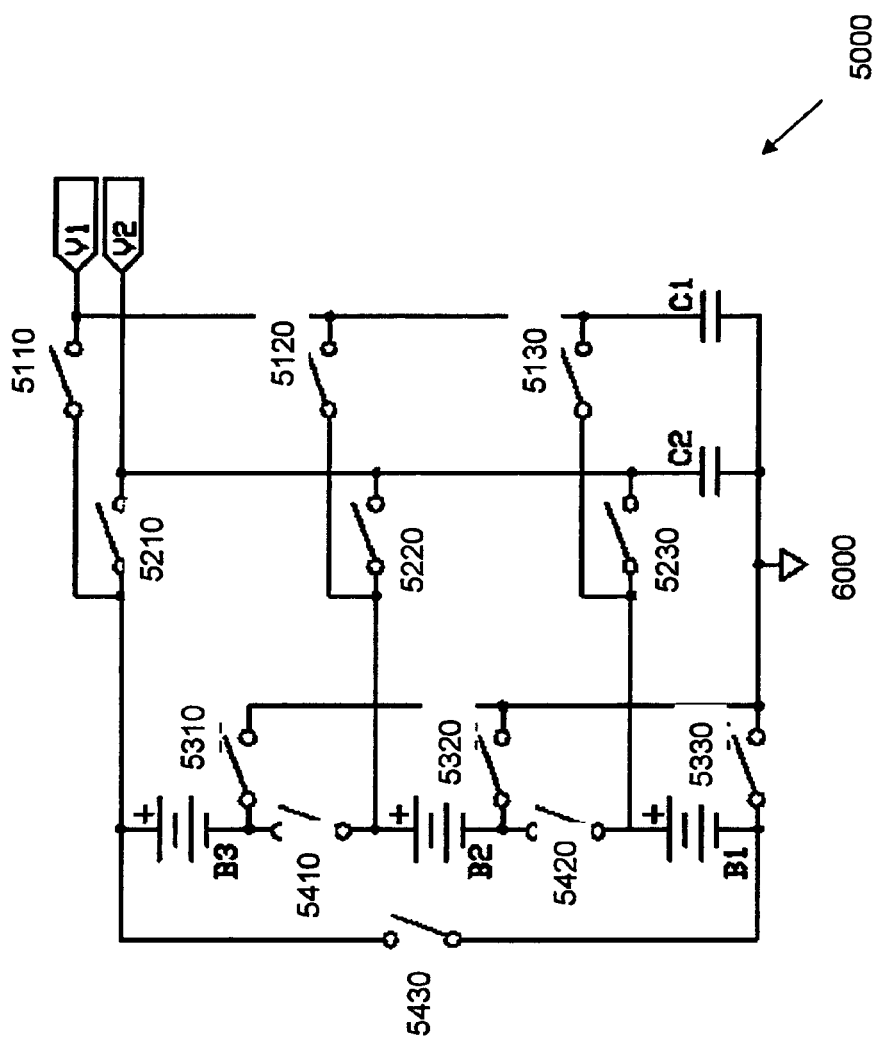
FIG. 7 is a schematic circuit diagram of a configurable power supply using the dual substrate MEMS switch of FIG. 1, which can output two voltage levels and switch between those levels.

One example of a portable application which can be addressed by the configurable power supply using MEMS switches is a portable laptop computer. FIG. 7 is a schematic circuit diagram showing one embodiment 5000 of the configurable power supply, coupled to a generic load 6000. This load 6000 may be a laptop computer, which needs at least two different power supply voltages V1 and V2. V2 drives the high voltage devices in a laptop (for example, the display), and V1 drives the low voltage devices (for example, the processor). As shown in FIG. 7, this circuit uses three battery cells B1=B2=B3=V1 and V2=3V1 to achieve the two voltages. Initially 5330, 5420, 5410, 5210 and 5130 are closed, so V1 is supplied by B1 and V2=B1+B2+B3 and B1 is grounded. But in this configuration B1 is loaded more than B2 and B3. So after some period of time, for example, about 5 minutes, all switches are opened and then 5320, 5410, 5430, 5230, and 5120 are closed. This may happen in less than about 50 usec, which is chosen to be much smaller than the RC time constant of C1 or C2 in parallel with their respective load. Now V1 is supplied by B2, V2=B2+B3+B1=3V1, and B2 is grounded. After another 5 minutes all switches are again opened and now 5420, 5430, 5310, 5220, and 5110 are closed. Now B3 is grounded and supplies the voltage to V1, while V2 is provided by B2+B1+B3.

The embodiment 5000 illustrated in FIG. 7 may be built on a single chip or substrate, or all switches and power cells could be discretely fabricated and bump bonded or otherwise coupled to a printed circuit board (PCB), or any combination of the two. The capacitors C1 and C2 may either be discrete components or microfabricated capacitors formed on the same or on a different substrate. The size of a single substrate that could support all 12 switches in the circuit may be <3 square mm, because of the very small size of the switch. This single circuit could potentially replace the myriad voltage converters that exist in laptops currently. As these voltage converters also use capacitors, there is no additional burden imposed by the need for C1 and C2 in the exemplary circuit.

Although not shown in FIG. 7, it should be understood that other components may be include to achieve other end or provide certain desirable characteristics. For example, inspection of FIG. 7 reveals that the individual MEMS switches 5100-5500 may be required to hot switch currents and voltages. As the MEMS switches are quite small, it may be important to protect them from power surges that may damage the switch. If the switches are required to only add one cell at a time in series, and the hot-switched voltage would then be low (typical cell voltages are 0.6V to 3V) and the MEMS switches themselves may be sufficiently robust to handle these voltages and currents. If not however, two switches and a diode may be employed to combine the power cells. The diode can do the first "hot" switch, and then the resistance of the diode is vanquished and the second parallel switch is then closed. Other components may also be added to the circuit, including discrete or microfabricated inductors, capacitors, resistor and transistors to provide a particular output or address a particular application.

The timing of the opening and closing of the plurality of MEMS switches may be under the control of a computer or microprocessor, such as microprocessor 10 shown in FIG. 2, in order to provide the needed outputs. Alternatively, additional power cells may be invoked automatically if the output voltage falls below a certain prescribed level. The configurations may be chosen to eliminate a failed or failing cell, to distribute the load evenly amongst the cells, to provide a specified current or voltage at a specified time or as demanded by the application.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes a configurable power supply using a dual substrate MEMS switch, it should be understood that these details are exemplary only, and that the systems and methods disclosed here may be applied to any number of alternative MEMS switch designs. Similarly, although the embodiment described herein pertains primarily to battery, it should be understood that the techniques may also be applied to continuously powered sources such as motor controllers, for example. Accordingly, the exemplary implementations set forth above, are intended to be illustrative, not limiting.

What is claimed is:

1. A method for manufacturing a configurable power supply, comprising:
   providing at least one MEMS switch;
   providing a plurality of power cells, each supplying a portion of an output; and
   coupling the at least one MEMS switch to at least one of the plurality of cells, such that the portion from at least one of the plurality of cells is combined with another portion from others of the plurality, to form a power supply circuit with an output that depends on a configuration of power cells coupled together
   wherein the at least one MEMS switch comprises
   a deformable plate formed in the device layer of a silicon-on-insulator switch substrate and coupled to the device layer by a plurality of spring beams;
   a plurality of electrical contacts formed on a via substrate; and
   the device layer of the silicon-on-insulator substrate bonded to the via substrate to form the plurality of MEMS switches.

2. The method of claim 1, wherein providing the plurality of MEMS switches comprises:
   forming a plurality of MEMS switches on a substrate;
   singulating the MEMS switches;
   coupling the plurality of MEMS switches to a printed circuit board; and
   coupling the printed circuit board to the plurality of power cells.

3. The method of claim 2, wherein forming the plurality of MEMS switches further comprises:

forming the deformable plate adjacent to and suspended from the switch substrate and coupled to the switch substrate by a plurality of spring beams;

forming a plurality of electrical contacts on a via substrate; and bonding the device layer of the silicon-on-insulator substrate to the via substrate to form the plurality of MEMS switches.

4. The method of claim 2, further comprising:

forming electrical connections between the at least one MEMS switch and the plurality of power cells; and forming the at least one MEMS switch and the plurality of power cells on a single substrate.

5. The method of claim 1, further comprising:

providing at least one capacitor which is coupled to at least one of the MEMS switch and one of the plurality of power cells.

6. The method of claim 5, wherein forming the at least one electrical via comprises:

forming at least one blind hole with a dead end wall on a front side of the second substrate;

forming a seed layer in the at least one blind hole;

depositing a conductive material onto the seed layer; and removing material from a rear side of the second substrate to remove the dead-end wall of the at least one blind hole.

7. The method of claim 1, further comprising coupling the configurable power supply to at least one of a subcircuit of a laptop computer, a circuit in a transport vehicle, and a circuit in a computer.

8. The method of claim 3, wherein the configuration of power cells has at least one of the following features:

excludes a non-functioning power cell from the power supply circuit;

excludes a failing power cell from the power supply circuit;

distributes a duty amongst the power cells in combination with other configurations;

provides a different output voltage from the power supply circuit compared to another configuration; and provides a different output current from the power supply circuit compared to another configuration.

9. The method of claim 3, wherein forming the deformable plate adjacent to and suspended from the switch substrate comprises:

etching a plurality of holes into a device layer of the silicon-on-insulator substrate;

etching a dielectric layer beneath the device layer of the silicon-on-insulator substrate through the plurality of holes; and etching an outline of the plate in the device layer of the silicon-on-insulator substrate.

10. A configurable power supply providing an output, comprising:

a plurality of power cells, each power cell supplying a portion of the output; and at least one MEMS switch, wherein the at least one MEMS switch is coupled to at least one of the plurality of power cells, wherein the MEMS switch couples the portion from the at least one of the plurality of power cells to another portion from others of the plurality, to form a power supply circuit which provides an output that depends on a configuration of power cells coupled together;

wherein the at least one MEMS switch comprises a deformable plate formed in a device layer of a silicon-on-insulator switch substrate and coupled to the device layer by a plurality of spring beams;

a plurality of electrical contacts formed on a via substrate; and wherein the device layer of the silicon-on-insulator substrate is bonded to the via substrate to form the plurality of MEMS switches.

11. The configurable power supply of claim 10, wherein the configuration of power cells has at least one of the following features:

omits a non-functioning power cell from operation in the power supply circuit;

omits a failing power cell from operation in the power supply circuit.

12. The configurable power supply of claim 10, wherein the configuration of power cells comprises:

a first configuration with one subset of power cells coupled together;

a second configuration with another subset of power cells coupled together, wherein the first configuration and the second configuration have at least one of the following features:

they distribute duty evenly amongst the power cells;

they provide a variable output voltage;

they provide a variable output current.

13. The configurable power supply of claim 10, further comprising at least one of:

an inductor;

a diode;

a capacitor;

a resistor; and a transistor.

14. The configurable power supply of claim 10, wherein the MEMS switches are configured in open and shut arrangements so as to provide a predetermined, variable output at a predetermined time.

15. The configurable power supply of claim 10, wherein the MEMS switches change their open and shut arrangements under the control of a microprocessor.

16. The configurable power supply of claim 10, wherein the MEMS switches are configured in open and shut arrangements in response to a demand of a load.

17. At least one of a laptop computer, a portable communication device, a medical device and a transport vehicle comprising the configurable power supply of claim 10.

18. The configurable power supply of claim 10, wherein the plurality of cells comprises a plurality of battery cells, wherein at least one battery cell comprises at least one of nickel cadmium, nickel-metal hydride, lead-acid, lithium ion, and lithium-ion polymer.

19. The medical device of claim 17, wherein the medical device comprises at least one of a hearing aid batteries, a drug delivery pump, a pacemaker, and an implantable device.

* * * * *